United States Patent
Mülders

(10) Patent No.: US 12,419,152 B2
(45) Date of Patent: Sep. 16, 2025

(54) LIGHT-EMITTING DIODE (LED) DEVICE WITH INDENTATIONS

(71) Applicant: LUMILEDS LLC, San Jose, CA (US)

(72) Inventor: Barbara Roswitha Mülders, Aachen (DE)

(73) Assignee: Lumileds Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/286,074

(22) PCT Filed: Apr. 18, 2022

(86) PCT No.: PCT/US2022/025219
§ 371 (c)(1),
(2) Date: Oct. 6, 2023

(87) PCT Pub. No.: WO2022/221762
PCT Pub. Date: Oct. 20, 2022

(65) Prior Publication Data
US 2024/0204160 A1  Jun. 20, 2024

Related U.S. Application Data

(60) Provisional application No. 63/175,864, filed on Apr. 16, 2021.

(51) Int. Cl.
*H10H 20/858*  (2025.01)
*F21S 41/148*  (2018.01)
*H01L 25/075*  (2006.01)

(52) U.S. Cl.
CPC ....... *H10H 20/8583* (2025.01); *F21S 41/148* (2018.01); *H01L 25/0753* (2013.01)

(58) Field of Classification Search
CPC .......... H05K 2201/09745; H05K 2201/10106; H05K 1/05; H05K 1/0271; H05K 2201/09036; H05K 2201/09063; H05K 2201/09072; H05K 2201/09136; H05K 1/0278; H05K 3/0061; H05K 1/0206;
(Continued)

(56) References Cited

U.S. PATENT DOCUMENTS 7,762,696 B2 * 7/2010 Wan .................. F21V 29/51
362/547
2009/0090928 A1 4/2009 Mori et al.
(Continued)

FOREIGN PATENT DOCUMENTS

| CN | 203131524 U | * | 8/2013 |
| CN | 110332471 A | * | 10/2019 |
| KR | 20100062064 A | * | 6/2010 |

OTHER PUBLICATIONS

Search English translation of CN-110332471-A (Year: 2019).*
(Continued)

*Primary Examiner* — Omar Rojas Cadima
(74) *Attorney, Agent, or Firm* — Volpe Koenig

(57) ABSTRACT

Light-emitting diode (LED) devices are described herein. An LED device includes a substrate. The substrate has a top surface and a bottom surface opposite the top surface. The bottom surface has at least one indentation that runs lengthwise across at least a portion of the substrate. The LED device also includes a semiconductor surface mounted device (SMD) over the top surface of the substrate.

16 Claims, 7 Drawing Sheets

(58) Field of Classification Search
CPC ............... H05K 1/021; H05K 1/0284; H05K 2201/066; H05K 2201/09827; H05K 3/0058; H05K 3/44; F21K 9/20; F21V 19/001; F21V 29/00; F21V 29/10; F21V 29/503; F21V 29/71; F21V 29/74; F21V 29/745; F21V 29/75; F21V 29/76; F21V 29/763; F21V 29/767; F21V 29/77; F21V 29/773; F21V 29/777; F21S 2/00; F21Y 2105/10; F21Y 2115/10; F21Y 2103/10; H01L 23/562

See application file for complete search history.

(56) References Cited

U.S. PATENT DOCUMENTS

| | | |
|---|---|---|
| 2011/0149577 A1 | 6/2011 | Shida et al. |
| 2013/0051015 A1* | 2/2013 | Creusen ............... F21V 29/76 362/235 |
| 2015/0351223 A1 | 12/2015 | Nii et al. |
| 2017/0158113 A1 | 6/2017 | Kanayama et al. |

OTHER PUBLICATIONS

Search English translation of CN-203131524-U (Year: 2013).*
Search English translation of KR-20100062064-A (Year: 2010).*
International Search Report and Written Opinion mailed Jul. 27, 2022 for PCT International Application No. PCT/US2022/025219.

* cited by examiner (a)

(b)

(a)

(b)

LIGHT-EMITTING DIODE (LED) DEVICE WITH INDENTATIONS

CROSS REFERENCE TO RELATED APPLICATIONS

This application is a § 371 application of International Application No. PCT/US2022/025219, filed Apr. 18, 2022, which claims the benefit of U.S. Provisional Patent Application No. 63/175,864, which was filed on Apr. 16, 2021, the contents of which are hereby incorporated by reference herein.

BACKGROUND

Light emitting diodes (LEDs for short) are more and more replacing older technology light sources due to superior technical properties, such as energy efficiency and lifetime. This may also be true for demanding applications in terms of, for example, luminance, luminosity, and/or beam shaping (e.g., for vehicle headlighting).

SUMMARY

Light-emitting diode (LED) devices are described herein. An LED device includes a substrate. The substrate has a top surface and a bottom surface opposite the top surface. The bottom surface has at least one indentation that runs lengthwise across at least a portion of the substrate. The LED device also includes a semiconductor surface mounted device (SMD) over the top surface of the substrate.

BRIEF DESCRIPTION OF THE DRAWINGS

A more detailed understanding can be had from the following description, given by way of example in conjunction with the accompanying drawings wherein:

FIG. 2a is a cross-sectional view of an example LED lighting device;

FIG. 2b is a perspective view of a circuit board of the example LED lighting device of FIG. 2a;

DETAILED DESCRIPTION

Figure 1:
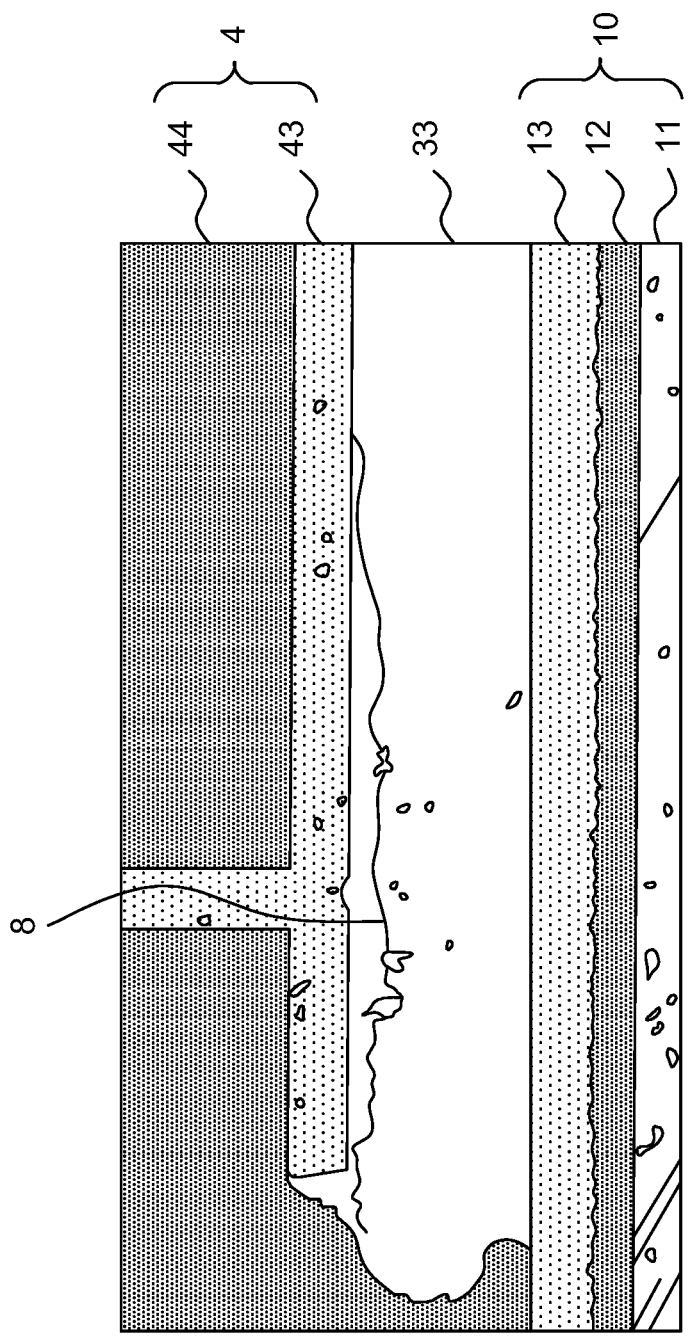
FIG. 1 is a diagram of an example microsection of a compromised solder connection in a semiconductor module.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Despite their energy efficiency, LEDs, and especially high power ones, may still generate considerable heat, which may requiring cooling, such as by thermally coupling the LED to a heatsink, to keep LED junction temperatures low. The same may be true for other semiconductor devices and especially high power ones.

In assemblies of high-power SMDs, such as LEDs mounted on heatsinks, due to different coefficients of thermal expansion (CTEs) and/or temperature gradients, to name just a few causes, considerable thermal stresses may build up, compromising the reliability of the assemblies. For example, for so-called die-on-ceramic (DoC) LED packages placed on metallic heatsinks such as, for example, on insulated metal substrate printed circuit boards (IMS PCBs), a soldering connection between the DoC and the IMS may develop cracks and may even break away. This may be caused, for example, by the largely different CTEs of the ceramic and the metal core of the IMS. Such thermal stress buildup not only applies to DoC packages but to all kinds of semiconductor modules encountering, during their life, changing temperatures or temperature gradients to name some causes. This may include, for example, the so-called chip-on-board ("CoB"), chip-scale-packaging ("CSP"), or wafer-level-packaging ("WLP") manufacturing techniques, which, in the LED industry, may be used, for example, in matrix systems, with the number of LEDs in the matrix increasing and separation distance between the LEDs decreasing with advancing technology.

Temperature changes experienced by SMD modules may occur due to switching the SMD module on and off. However, temperature changes may also occur due to changing environmental conditions. For example, because the solder connection between the SMD and substrate is free of stress when soldered, a temperature increase from room temperature when the SMD module is switched on moves the temperature towards the soldering temperature, thus actually decreasing thermal stress in the solder connection. Of course, any change of thermal stress may generate micromovements within the materials of the SMD module. Accordingly, switching on the SMD module may not be not uncritical and the temperature decrease after switching off the SMD module may increase thermal stress more critically. In situations where the SMD module is exposed to a cold environment, the SMD module may brought to below room temperature. As this is farther away from the soldering temperature, this may aggravate thermal stress even more.

This may be particularly prominent in automotive applications where car components must be guaranteed to be operational at far below freezing temperatures and where the environmental temperature of car headlights may change relatively rapidly on engine turn on and off. Additionally, in situations the car is parked and the engine is turned off outside in winter, relatively swiftly decreasing temperatures may be particularly problematic. To guarantee the reliability of cars, the Automotive industry has set very harsh requirements for SMD modules for automotive use. Concerning thermal stress caused by changing environmental conditions, automotive electronic modules have to pass severe thermal shock ("TMSK") tests exposing the modules to various thermal cycles as defined by various standardization bodies of the electronic industry. JEDEC's JESD22-A104 is one example of such a standard prescribing various harsh thermal cycles spanning a temperature from as low −65° C. to as high as 200° C.

FIG. 1 is a diagram of an example microsection of a compromised solder connection 33 in a semiconductor module compromised in a thermal shock testing. As shown in the example in FIG. 1, the solder connection 33 between a ceramic sub-mount 4 and the IMS PCB 10 has developed a crack 8. In the illustrated example, the ceramic sub-mount includes a ceramic package 44 and metallization 43, and the IMS PCB 10 includes a metal core 11, an insulating layer 12 and metallization 13.

Figure 2:
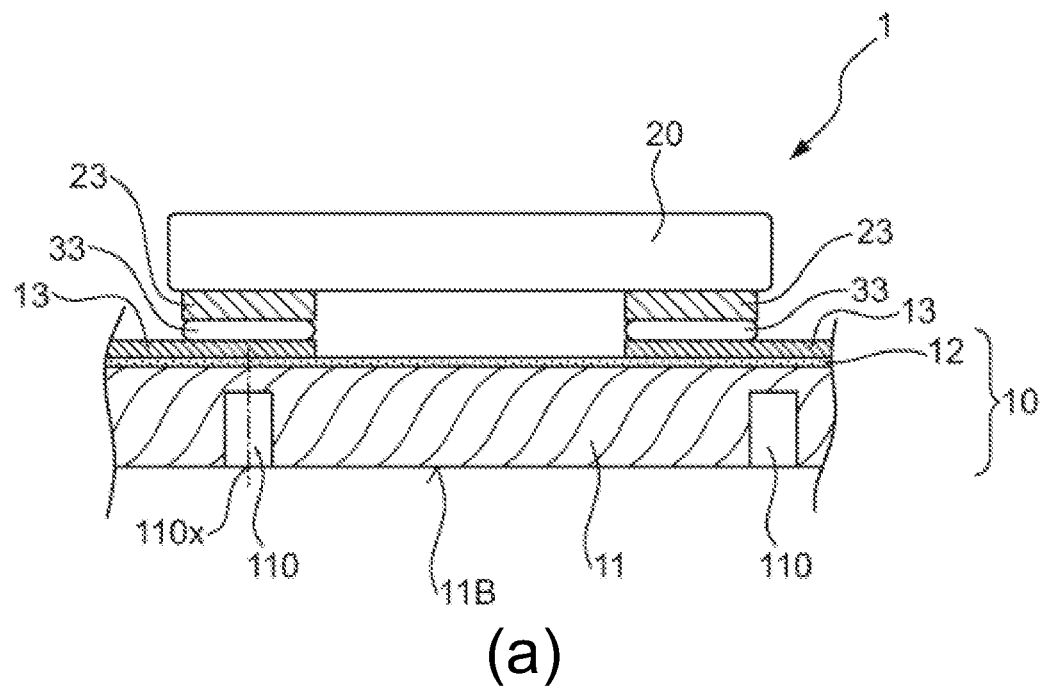
Figure 2:
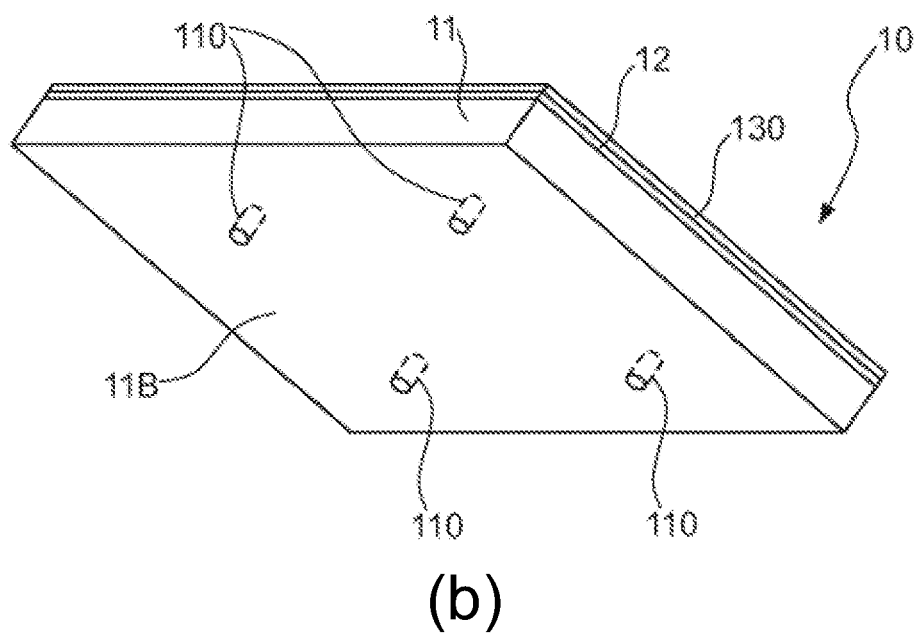

FIG. 2*a* is a cross-sectional view of an example LED lighting device. In the example illustrated in FIG. 2*a*, a circuit assembly 1 includes a circuit component 20 mounted on an IMS PCB 10. Contact pads 23 of the circuit component 20 are soldered to the conductive tracks 13 of the IMS PCB 10 via solder interconnect 33. The IMS PCB 10 includes a metal core 11 and a dielectric layer 12.

FIG. 2*b* is a perspective view of a circuit board of the example LED lighting device of FIG. 2*a*. In the example illustrated in FIG. 2*b*, the IMS PCB 10 includes the metal core 11, the contact pad 12 and a copper layer 130 from which the conductive tracks 13 may be etched.

In the examples in both Figures, and as described in WO2020078752A1, which is hereby incorporated by reference herein in its entirety, one or more blind holes 110 in the shape of a right cylinder may be provided in the metal core 11 underneath the solder interconnect 33 and formed through the bottom surface 11B of the metal core 11. The longitudinal axis of the blind hole 110 is labeled 110*a* in FIG. 2*a*. This may alleviate some of the stress that may otherwise result in cracking.

While such upright cylinder blind holes may provide progress, the embodiments described herein provide for further improvement that may permit such devices to pass even the hardest TMSK tests by foreseeing a longitudinal indentation in a bottom surface of a substrate of a semiconductor module, the bottom surface being opposite to a mounting surface of the substrate onto which an SMD of the semiconductor module is mounted. The longitudinal shape of the indentation may add flexibility to the substrate influencing size and distribution of thermal stress in the mounting connection of the SMD to the substrate in a manner positive for the maintenance and reliability of the semiconductor module. In particular, in a typical setup, stress might be reduced and/or more evenly distributed, and detrimental cracks in a solder interconnect may be avoided.

FIG. 3*a* is a diagram of an example of an LED lighting device in full perspective view. FIG. 3*b* is a diagram of an example of an LED lighting device in cut-away perspective taken along the line A-A in FIG. 3*a*. In the example illustrated in FIGS. 3*a* and 3*b*, longitudinal indentations are formed as grooves 6 in the bottom surface of the heatsink 10. The bottom surface (not labeled) of the heatsink 10 may be opposite to the mounting surface (not labeled) onto which the LEDs 2 may be bonded, for example via sub-mounts 4. The grooves may be realized as two pairs of parallel rectangular grooves crossing each other at a right angle below an arrangement of four LEDs 2. Each groove 6 may traverse below a line connecting the mid-points of two neighboring LEDs 2. This may be better viewed in FIG. 4.

Figure 3:
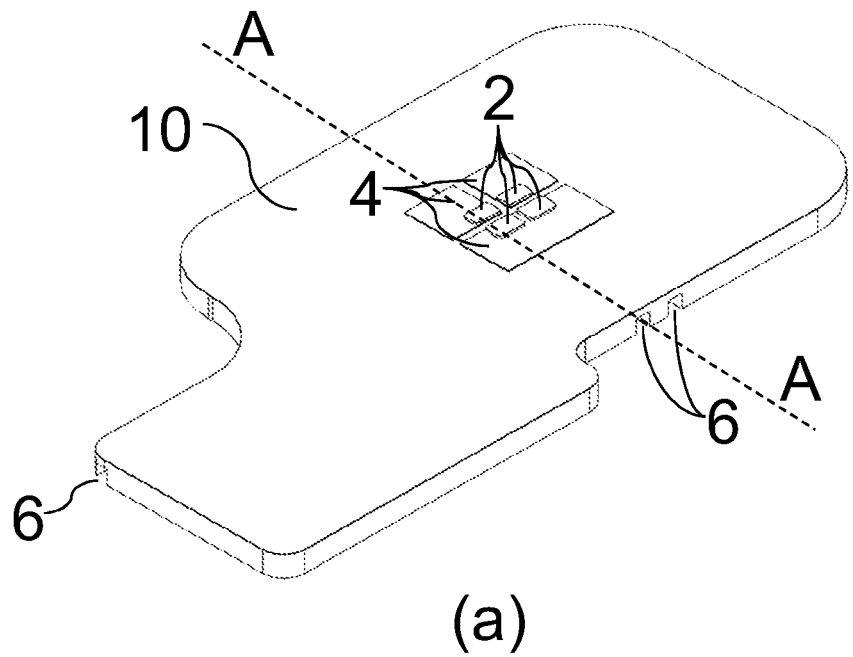
FIG. 3a is a diagram of an example of an LED lighting device in full perspective view.
FIG. 3b is a diagram of an example of an LED lighting device in cut-away perspective.
Figure 3:
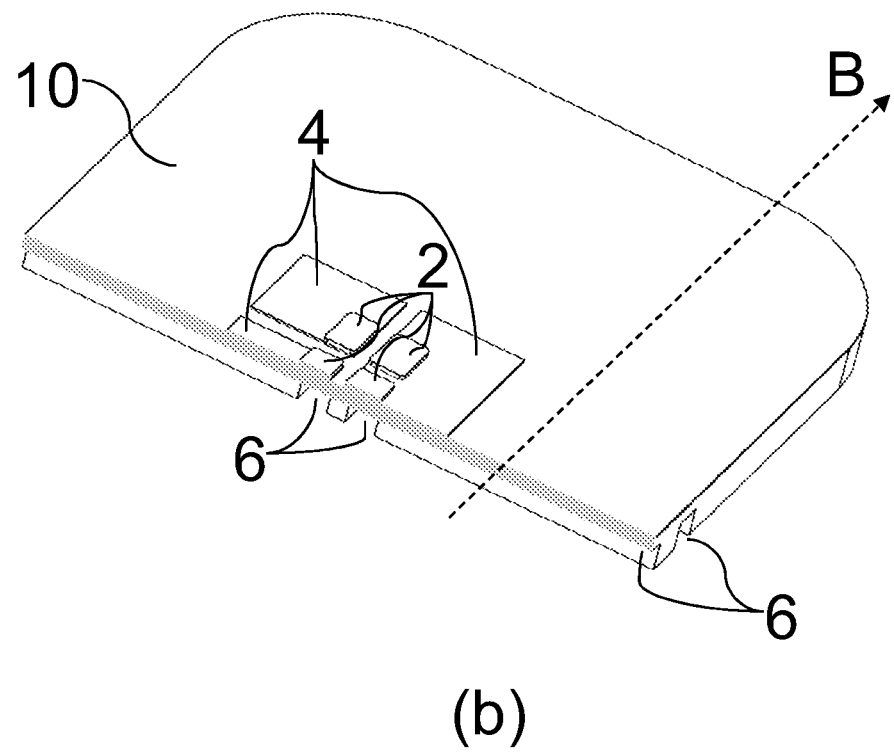
Figure 4:
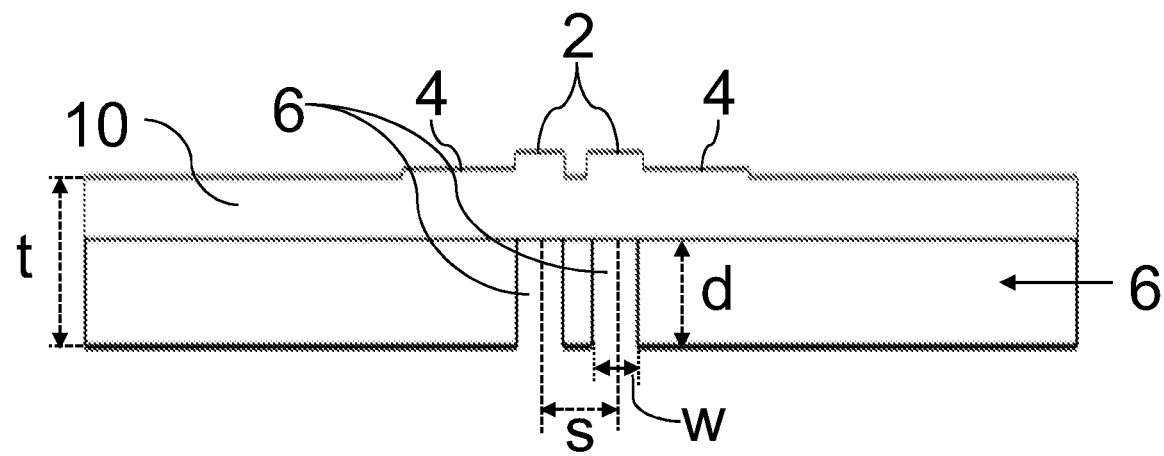
FIG. 4 is a plan view of the cut-away view of FIG. 3b.

FIG. 4 is a plan view of the cut-away view of FIG. 3*b*. The cross-sectional view of FIG. 4 shows a rectangular profile of the grooves with depth d and width w and shows two parallel grooves of a pair with their middle lines being separated by distance s. Because of the cross section being chosen along line A-A of FIG. 3(*a*) cutting through one of the grooves 6, such groove 6 is visible in the plan view of FIG. 4 as extending from left to right over the complete extension of the semiconductor module. Suitable dimensions for these entities might be: width w between 0.1 and 3 mm, depth d between 25 and 95% of a thickness t of substrate/heatsink 10, and distance s between 0.1 and 4 mm, where groove distance s might be specifically selected in relation to a size of the SMD, here the LED arrangement. Specific values might be a width w of 1 mm; a depth d of 80% of the substrate thickness amounting typically e.g. to 1 mm for an IMS with aluminum core and to 0.8 mm for an IMS with copper core; and a distance s of 1.625 mm.

Figure 5:
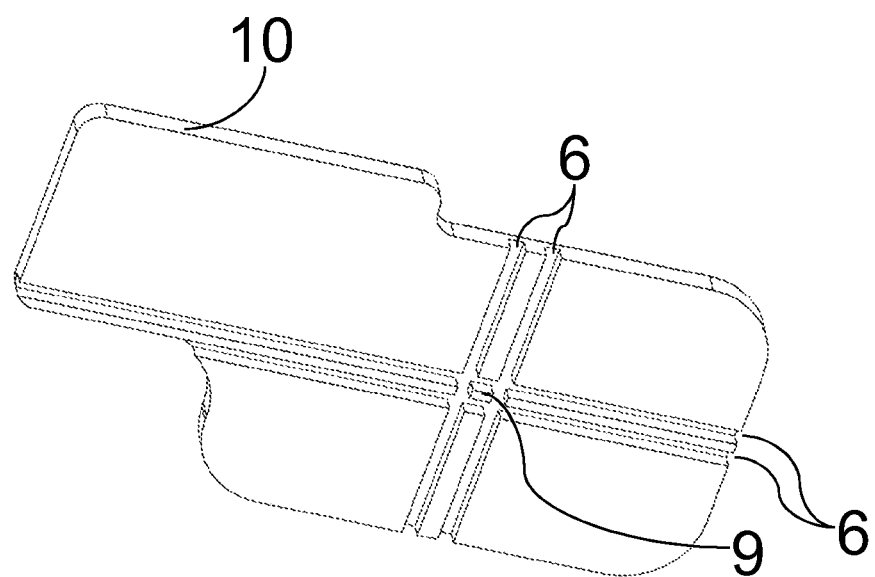
FIG. 5 is a perspective view of the example LED device of FIG. 3a from a bottom side of the substrate.

FIG. 5 is a perspective view of the example LED device of FIG. 3*a* from a bottom side of the substrate. In the example illustrated in FIG. 5, the grooves 6 are shown as two crossing pairs of grooves 6 that each extend over a complete extension of the heatsink 10. The two crossing pairs of grooves 6 may be considered to cross at or around point 9. The result may be one or more grooves having a rectangular profile, which may be easy to manufacture, for example by a cutting tool intruding into and being moved relative to heatsink 10. The rectangular groove profile, and in particular the right angles of the groove walls with the groove bottom, may be a natural result of the cutting tool, but may also provide a particularly high flexibility of the heatsink 10 to alleviate thermal stress on LED switching and on change of environmental temperature. Forming pairs of parallel grooves may further increase such flexibility, for example by allowing neighboring deformation axes around which the heatsink 10 may deform to relieve thermal stress buildup. With a sheet-like heatsink 10, using crossed pairs of parallel grooves may allow deformation around both Cartesian axes of the sheet plane. Crossing the pairs of parallel grooves in a point 9, which may be immediately below the midpoint of the arrangement of LEDs 2, may yield maximum flexibility near the solder connections, thus directly alleviating stress buildup in the solder interconnects. However, placing a single groove or longitudinal indentation immediately below a particular LED 2 may provide sufficient relief for the thermal stress buildup in the LEDs solder connections.

While a single groove might be placed immediately below an LED, such as immediately below a middle line of the solder connections of the LED, alternatively, a pair of parallel grooves might be centered below the LED. For example, the middle line in-between the parallel grooves might be placed immediately below the middle line of the solder connections of the LED. With several LEDs in a line arrangement, the parallel grooves might in the same way be centered below a middle line of such line arrangement. With two parallel lines of LEDs (a 2×n matrix of LEDs), three parallel grooves might be chosen with the LED lines being centered in the middle of the outer pairs of the three grooves (the left LED line in the middle of the left and the middle groove, and the right LED line in the middle of the middle and the right groove). Such groove arrangements positioning the LEDs in-between the grooves, in some configurations, might further relieve thermal stress in the LEDs' solder connections.

One of ordinary skill in the art will understand that the details in the embodiment of FIG. 3-5 are not mandatory for present disclosure. For example, the groove profile does not need to be rectangular but, for example, e.g., instead of a sharp right angle, the edge between groove walls and the bottom might be rounded, which might be even easier to manufacture by a cutting tool. Furthermore, the grooves may not need to extend over the full bottom surface of heatsink 10 as the most critical area as to breakage of the solder connections might be just a small area immediately below the LEDs 2 or just below the solder connections. Further, the shape of the indentation does not need to be a straight channel but may take any form as long as the shape remains longitudinal (e.g., with indentation extension in the longitudinal dimension being considerably larger than in the dimension transversal thereto). Curved shapes like arcs or ovals might be used as well. Such indentations may be made by milling a pre-fabricated heatsink, doing a series of connected drill holes, or by stamping or using a molding process for making the heatsink or metal core of the IMS with an appropriate mold.

Figure 6:
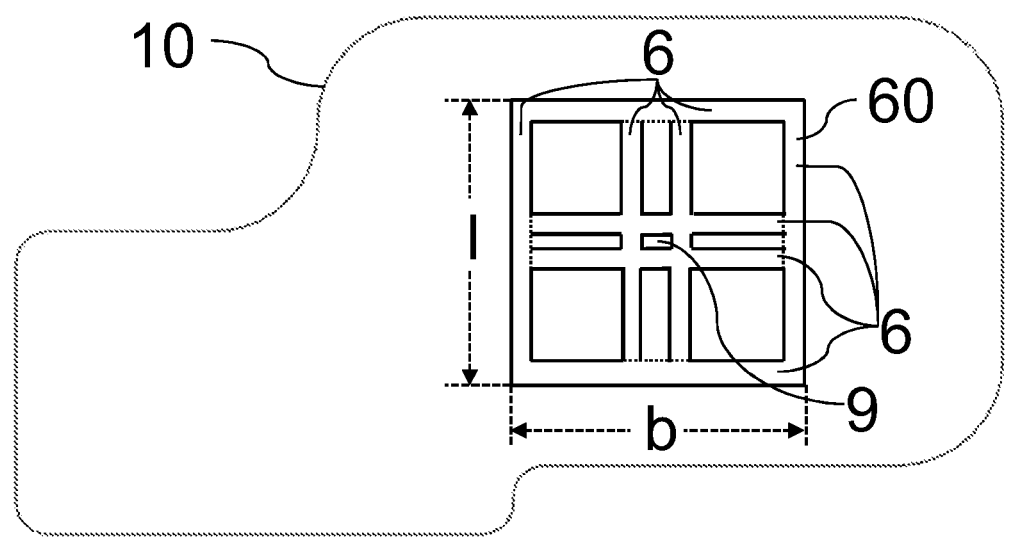
FIG. 6 is a plan view of another example of an LED device from a bottom side of the substrate.

FIG. 6 shows another embodiment of a disclosed semiconductor module as seen in plan view from a bottom side of the substrate/heatsink 10. Like in FIGS. 3-5 two pairs of parallel grooves 6 in the heatsink's bottom surface cross at a right angle in a point 9 immediately below the midpoint of the arrangement of LEDs 2 mounted on the mounting surface of heatsink 10 opposite the bottom surface (LEDs 2 not visible in the view of FIG. 6). However, unlike in FIGS. 3-5, the crossing pairs of grooves 6 do not extend over the complete bottom surface of heatsink 10 but end at the sides of a rectangle 60 with width b and length l formed by further (contiguous) grooves 6 and being centered in point 9, thus, below the midpoint of the LED arrangement. This might also be described as the rectangle 60 of grooves 6 framing the crossing pairs of parallel grooves 6. Frame dimensions may be a width b between 1.1 and 5 times a width of the arrangement of LEDs 2, and a length l between 1.1 and 5 times a length of the arrangement of LEDs 2, with specific values, as appropriate for a typical size of an arrangement of 2×2 LEDs, of b=l=20 mm.

Arranging the grooves in such framed configuration might have several advantages. E.g., milling or laser ablating tools might be arranged to manufacture such framed configuration independent from the dimensions (in particular size and shape) of the specific substrate used. The dimensions of the framing rectangle and the inside located grooves might be selected according to the dimensions of the SMD placed on the mounting side above the frame and/or on the position and size of the solder interconnects of the SMD. On basis of such not only the shape and size of the frame and grooves inside the frame might be selected but also the number and arrangement pattern of the grooves inside. In particular, for some configurations, it might be sufficient to just foresee the frame alone, i.e., without any grooves inside the frame.

Using framing might yield sufficient stress relief independent from the further details of the semiconductor module like further electrical components on the substrate and dimensions of the substrate. This might be particularly useful for mass manufacturing substrates with standardized tools and processes independent of the particular details of various forms of semiconductor modules.

Figure 7:
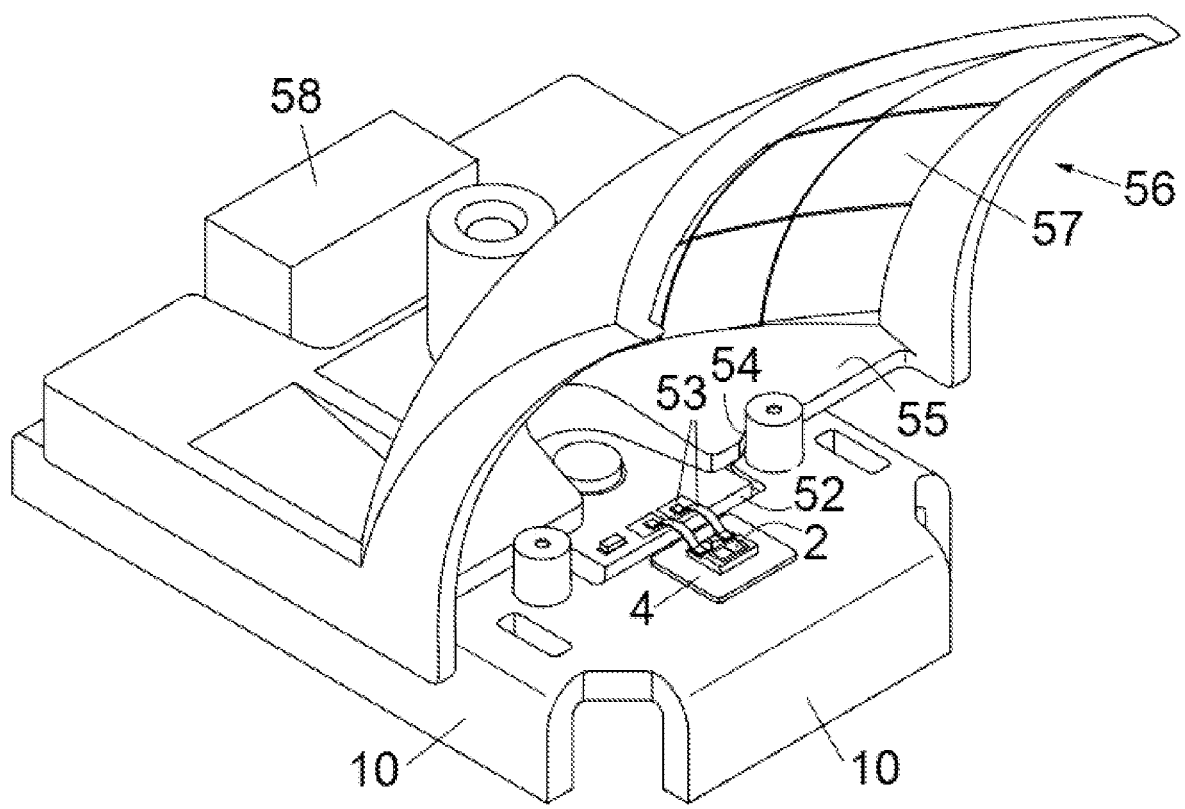
FIG. 7 shows yet another example of an LED device in perspective view.

FIG. 7 shows yet another embodiment of a disclosed semiconductor module, here in the form of an LED module, in perspective view. Two LEDs 2 are mounted via, e.g. ceramic, sub-mount 4 to the mounting surface of metal heatsink 10. Electrically, the LEDs 2 are connected via ribbon bonds 53 to PCB 52 carrying electrical connector 58 for external electrical connection for powering LEDs 2. Heatsink 10 carries alignment pins 54 being touched by a mechanical interface 55 fixed to heatsink 10 and being one-piece with optical component, here reflector, 56 with reflective surface 57 receiving light from the LEDs 2 in operation of the LED module. This module can be readily inserted into a corresponding lamp fixture to make up, with further components, e.g. a vehicle headlight.

While the foregoing has concentrated on an LED arrangement placed, via a sub-mount e.g. made of ceramics, on an IMS PCB or on a metal heatsink this disclosure applies to general semiconductor modules, e.g. with high-power converters and power resistors as SMDs, or bonding the SMDs directly to the PCB without a sub-mount. In particular, LED modules, like e.g. matrix lights, made using CSP, CoB, and WLP technologies are explicitly addressed here. Present disclosure may generate benefits for all these configurations. As well, instead of heatsinks made of metal also other materials like high thermally conductive plastics may benefit from present disclosure.

Figure 8:
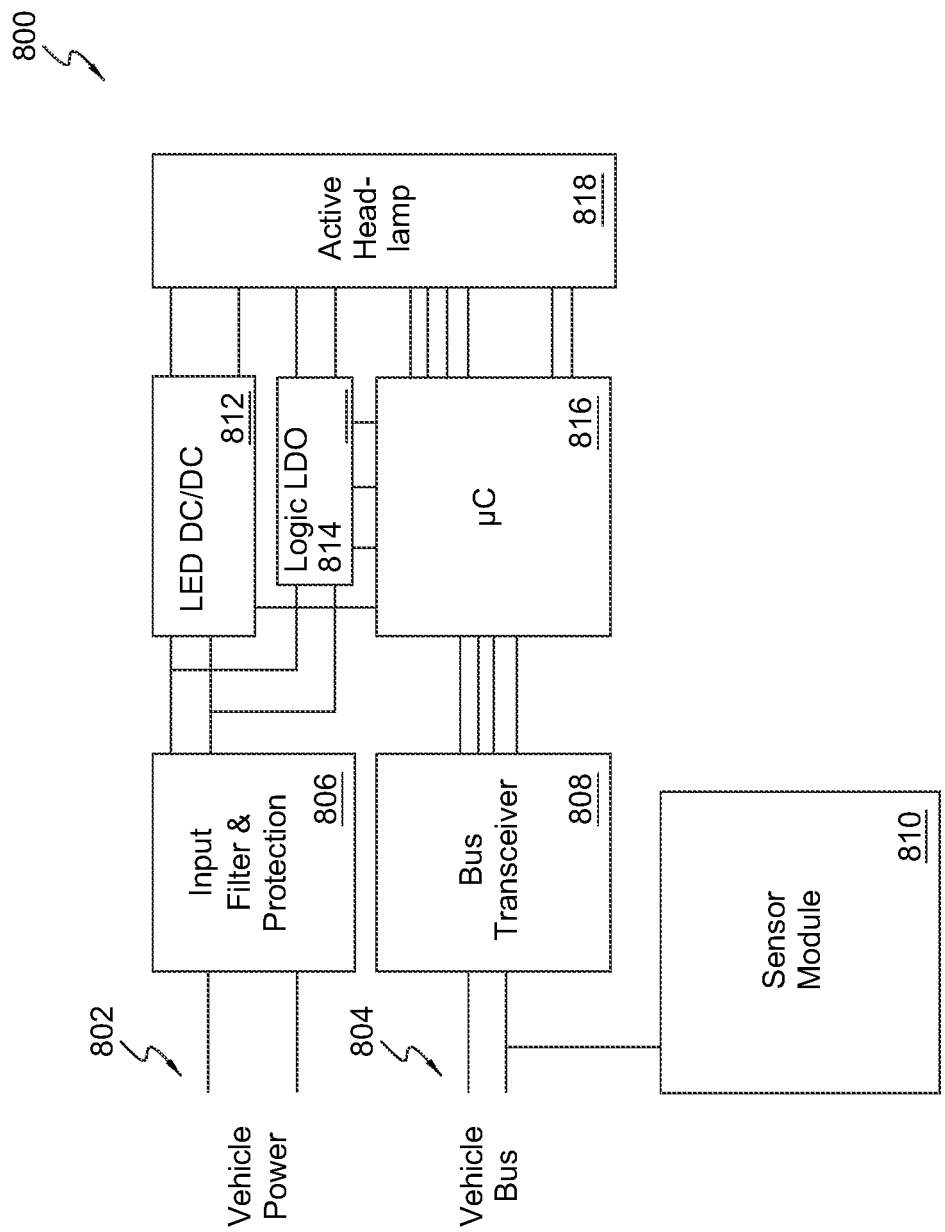
FIG. 8 is a diagram of an example vehicle headlamp system.

FIG. 8 is a diagram of an example vehicle headlamp system 800 that may incorporate one or more of the embodiments and examples described herein. The example vehicle headlamp system 800 illustrated in FIG. 8 includes power lines 802, a data bus 804, an input filter and protection module 806, a bus transceiver 808, a sensor module 810, an LED direct current to direct current (DC/DC) module 812, a logic low-dropout (LDO) module 814, a micro-controller 816 and an active head lamp 818.

The power lines 802 may have inputs that receive power from a vehicle, and the data bus 804 may have inputs/outputs over which data may be exchanged between the vehicle and the vehicle headlamp system 800. For example, the vehicle headlamp system 800 may receive instructions from other locations in the vehicle, such as instructions to turn on turn signaling or turn on headlamps, and may send feedback to other locations in the vehicle if desired. The sensor module 810 may be communicatively coupled to the data bus 804 and may provide additional data to the vehicle headlamp system 800 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 800. In FIG. 8, the headlamp controller may be a micro-controller, such as micro-controller (pc) 716. The micro-controller 816 may be communicatively coupled to the data bus 804.

The input filter and protection module 806 may be electrically coupled to the power lines 802 and may, for example, support various filters to reduce conducted emissions and provide power immunity. Additionally, the input filter and protection module 806 may provide electrostatic discharge (ESD) protection, load-dump protection, alternator field decay protection, and/or reverse polarity protection.

The LED DC/DC module 812 may be coupled between the input filter and protection module 806 and the active headlamp 818 to receive filtered power and provide a drive current to power LEDs in the LED array in the active headlamp 818. The LED DC/DC module 812 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 814 may be coupled to the input filter and protection module 806 to receive the filtered power. The logic LDO module 814 may also be coupled to the micro-controller 816 and the active headlamp 818 to provide power to the micro-controller 816 and/or electronics in the active headlamp 818, such as CMOS logic.

The bus transceiver 808 may have, for example, a universal asynchronous receiver transmitter (UART) or serial peripheral interface (SPI) interface and may be coupled to the micro-controller 816. The micro-controller 816 may translate vehicle input based on, or including, data from the sensor module 810. The translated vehicle input may include a video signal that is transferrable to an image buffer in the active headlamp 818. In addition, the micro-controller 816 may load default image frames and test for open/short pixels during startup. In embodiments, an SPI interface may load an image buffer in CMOS. Image frames may be full frame, differential or partial frames. Other features of micro-controller 816 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 9:
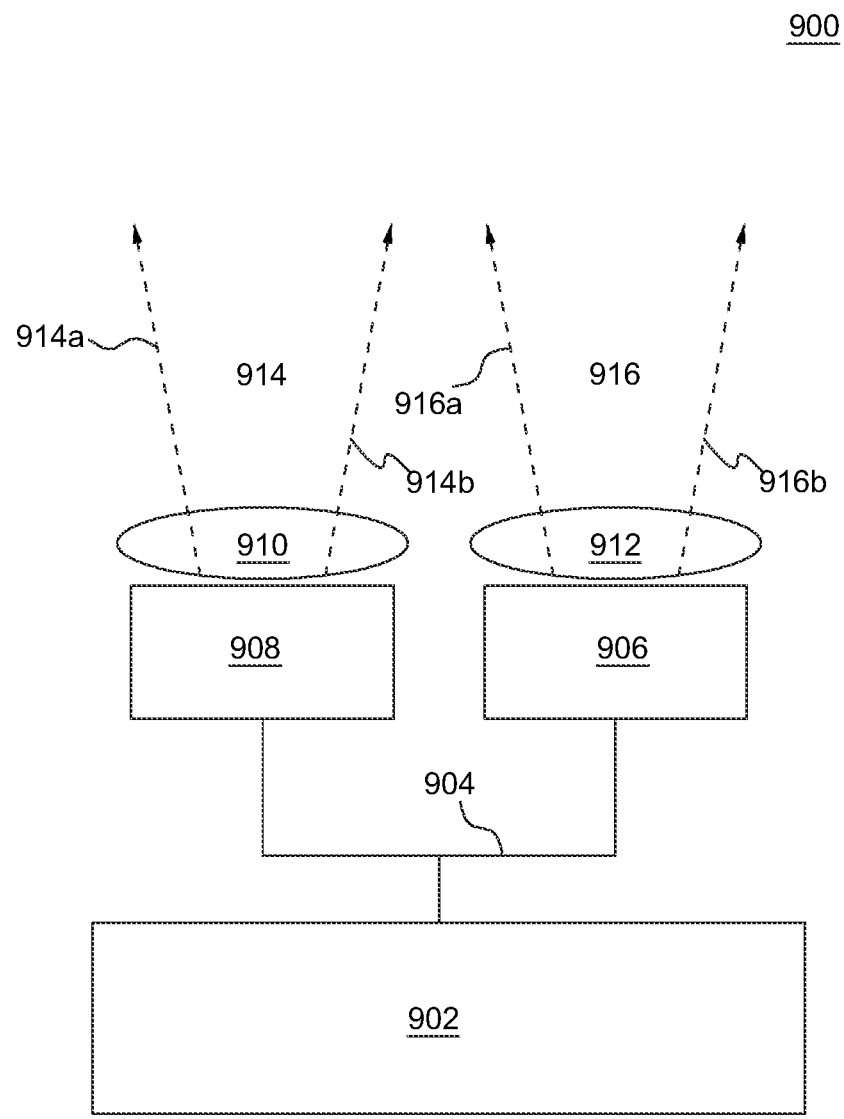
FIG. 9 is a diagram of another example vehicle headlamp system.

FIG. 9 is a diagram of another example vehicle headlamp system 800. The example vehicle headlamp system 900 illustrated in FIG. 9 includes an application platform 902, two LED lighting systems 906 and 908, and secondary optics 910 and 912.

The LED lighting system 908 may emit light beams 914 (shown between arrows 914a and 914b in FIG. 9). The LED lighting system 906 may emit light beams 916 (shown between arrows 916a and 916b in FIG. 9). In the embodiment shown in FIG. 9, a secondary optic 910 is adjacent the LED lighting system 908, and the light emitted from the LED lighting system 908 passes through the secondary optic 910. Similarly, a secondary optic 912 is adjacent the LED lighting system 906, and the light emitted from the LED lighting system 906 passes through the secondary optic 912. In alternative embodiments, no secondary optics 910/912 are provided in the vehicle headlamp system.

Where included, the secondary optics 910/912 may be or include one or more light guides. The one or more light guides may be edge lit or may have an interior opening that defines an interior edge of the light guide. LED lighting systems 908 and 906 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 908 and 906 in a desired manner, such as, for example, with a gradient, a chamfered distribution, a narrow distribution, a wide distribution, or an angular distribution.

The application platform 902 may provide power and/or data to the LED lighting systems 906 and/or 908 via lines 904, which may include one or more or a portion of the power lines 802 and the data bus 804 of FIG. 8. One or more sensors (which may be the sensors in the vehicle headlamp system 900 or other additional sensors) may be internal or external to the housing of the application platform 902. Alternatively, or in addition, as shown in the example vehicle headlamp system 800 of FIG. 8, each LED lighting system 908 and 906 may include its own sensor module, connectivity and control module, power module, and/or LED array.

In embodiments, the vehicle headlamp system 900 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 906 and 908 may be sensors (e.g., similar to sensors in the sensor module 810 of FIG. 8) that identify portions of a scene (e.g., roadway or pedestrian crossing) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light-emitting diode (LED) device comprising:
   a circuit board comprising a top surface and a bottom surface opposite the top surface, wherein the circuit board has a length and a width, wherein the length of the circuit board has a larger magnitude than a magnitude of the width of the circuit board, and wherein a distance between the top surface and the bottom surface defines a depth of the circuit board; and
   a plurality of surface mounted devices (SMDs) on the top surface of the circuit board and spaced apart from each other along the length the circuit board,
   wherein the bottom surface of the circuit board comprises a plurality of pairs of grooves that each extend across the entire width of the circuit board with each pair passing directly under a respective one of the plurality of SMDs.

2. The device according to claim 1, wherein each groove has a width between 0.1 and 3 mm and a depth between 25 and 95% of the depth of the circuit board.

3. The device according to claim 2, wherein:
each of the plurality of pairs of grooves and the at least one other groove comprises two pairs of separated parallel grooves that run perpendicular to each other and cross below the SMD, forming a rectangle centered below the SMD.

4. The device according to claim 2, wherein:
the SMD comprises one or more LED dies on a ceramic sub-mount.

5. The device according to claim 4, wherein each of the plurality of pairs of grooves is a pair of two separated parallel grooves.

6. The device according to claim 5, wherein the bottom surface of the circuit board further comprises at least one other groove that runs across the entire length of the circuit board in a direction perpendicular to the two separated parallel grooves.

7. The device according to claim 5, wherein center lines of each of the two separated parallel grooves are separated by a distance between 0.1 and 4 mm.

8. The device according to claim 6, wherein the two separated parallel grooves and the at least one other groove cross below the SMD.

9. The device according to claim 8, wherein the two separated parallel grooves and the at least one other groove cross below the SMD at a right angle.

10. The device according to claim 1, wherein the at least one other groove indentation comprises at least one groove forms a rectangle centered below the SMD.

11. The device according to claim 10, wherein:
the rectangle has a width between 1.1 and 5 times a width of the SMD, and
the rectangle has a length between 1.1 and 5 times a length of the SMD.

12. The device according to claim 6, wherein the plurality of SMDs comprises a plurality of light-emitting diodes (LEDs), and the two separated grooves and the at least one other groove cross below a midpoint of the plurality of light-emitting diodes (LEDs).

13. The device according to claim 6, wherein the SMD comprises at least one LED, and the two separated grooves and the at least one other groove cross below the same LED.

14. An LED module comprising
a circuit board comprising a top surface and a bottom surface opposite the top surface, wherein the circuit board has a length and a width, wherein the length of the circuit board has a larger magnitude than a magnitude of the width of the circuit board, and wherein a distance between the top surface and the bottom surface defines a depth of the circuit board;
a plurality of surface mounted devices (SMDs) on the top surface of the circuit board and spaced apart from each other along the length the circuit board,
wherein the bottom surface of the circuit board comprises a plurality of pairs of grooves that each extend across the entire width of the circuit board with each pair passing directly under a respective one of the plurality of SMDs; and
an electrical connector configured to provide power to the semiconductor SMD.

15. The LED module according to claim 14, further comprising an optical component positioned to receive light emitted from the plurality of SMDs in operation.

16. A vehicle headlight comprising:
a lamp fixture; and
a light-emitting diode (LED) device mounted to the lamp fixture, the LED device comprising:
a circuit board comprising a top surface and a bottom surface opposite the top surface, wherein the circuit board has a length and a width, wherein the length of the circuit board has a larger magnitude than a magnitude of the width of the circuit board substrate, and wherein a distance between the top surface and the bottom surface defines a depth of the circuit board, and
a plurality of surface mounted devices (SMDs) on the top surface of the circuit board and spaced apart from each other along the length the circuit board,
wherein the bottom surface of the circuit board comprises a plurality of pairs of grooves that each extend across the entire width of the circuit board with each pair passing directly under a respective one of the plurality of SMDs.

* * * * *